United States Patent
Ikeda et al.

(10) Patent No.: US 7,930,123 B2
(45) Date of Patent: Apr. 19, 2011

(54) METHOD, APPARATUS, AND COMPUTER READABLE MEDIUM FOR EVALUATING A SAMPLING INSPECTION

(75) Inventors: Takahiro Ikeda, Yokohama (JP); Masafumi Asano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/359,194

(22) Filed: Jan. 23, 2009

(65) Prior Publication Data

US 2009/0192743 A1  Jul. 30, 2009

(30) Foreign Application Priority Data

Jan. 24, 2008  (JP) .................................. 2008-013360

(51) Int. Cl.
*G01N 37/00* (2006.01)
(52) U.S. Cl. ........................... 702/83; 702/181; 702/182
(58) Field of Classification Search ................ 702/83
See application file for complete search history.

(56) References Cited

U.S. PATENT DOCUMENTS

| | | | |
|---|---|---|---|
| 6,868,299 | B2 | 3/2005 | Chandra et al. |
| 7,570,797 | B1 * | 8/2009 | Wang et al. .................. 382/145 |
| 2004/0107062 | A1 * | 6/2004 | Lawrence ....................... 702/83 |
| 2004/0210335 | A1 * | 10/2004 | Chandra et al. ............... 700/109 |

FOREIGN PATENT DOCUMENTS

JP    2007-235108    9/2007

OTHER PUBLICATIONS

Dodge, H. F. et al., "Single Sampling and Double Sampling Inspection Tables," The Bell System Technical Journal, vol. XX, No. 1, pp. 1-61, (Jan. 1941).
Military Standard, 'Sampling Procedures and Tables for Inspection by Variables for Percent Defective; Office of the Assistant Secretary of Defense, MIL-STD-414, pp. i-viii, and 1-110, (Jun. 11, 1957).

* cited by examiner

*Primary Examiner* — Jonathan C Teixeira Moffat
(74) *Attorney, Agent, or Firm* — Finnegan, Henderson, Farabow, Garrett & Dunner, L.L.P.

(57) ABSTRACT

A method for evaluating a sampling inspection. The method includes determining a first and a second sampling plan, and obtaining a first and a second measured value of a production lot based on the first and the second sampling plans, respectively. The method also includes calculating a first and a second acceptance variable based on the first and second measured values, respectively, and calculating a first and second acceptance probabilities based on the first and second acceptance variables, respectively. The method further includes calculating a first and a second operating characteristic of the first and second sampling plans based on the first and second acceptance probabilities, respectively, and evaluating the first and the second operating characteristics.

15 Claims, 14 Drawing Sheets

| LOT NUMBER | WAFER NUMBER | CHIP NUMBER | PATTERN NUMBER | DIMENSION |
|---|---|---|---|---|
| 1 | 1 | 1 | 1 | 0.102 |
| 1 | 1 | 1 | 2 | 0.111 |
| ⋮ | ⋮ | ⋮ | ⋮ | ⋮ |
| 100 | 25 | 5 | 4 | 0.111 |
| 100 | 25 | 5 | 5 | 0.103 |

| LOT NUMBER | SAMPLE WAFER 1 | SAMPLE WAFER 2 | ... | SAMPLE WAFER 25 | FIRST ACCEPTANCE VARIABLES | |
|---|---|---|---|---|---|---|
| | | | | | MINIMUM BVALUE | MAXIMUM VALUE |
| 1 | 0.102 | 0.101 | ... | 0.098 | 0.098 | 0.102 |
| 2 | 0.111 | 0.101 | ... | 0.100 | 0.100 | 0.111 |
| ... | ... | ... | ... | ... | ... | ... |
| 100 | 0.103 | 0.100 | ... | 0.103 | 0.099 | 0.105 |

FIG. 5

METHOD, APPARATUS, AND COMPUTER READABLE MEDIUM FOR EVALUATING A SAMPLING INSPECTION

CROSS-REFERENCE TO RELATED APPLICATION

This application is based upon and claims the benefit of priority from the prior Japanese Patent Application No. 2008-13360 filed on Jan. 24, 2008, the entire contents of which are incorporated herein by reference.

BACKGROUND OF THE INVENTION

1. Field of the Invention

The present invention relates to a sampling inspection estimating method, a sampling inspection estimating apparatus, and a sampling inspection estimating program. More particularly, the invention relates to a method of estimating a sampling inspection in a process of manufacturing a semiconductor device, a sampling inspection estimating apparatus for the sampling inspection, and a sampling inspection estimating program for the sampling inspection.

2. Related Art

The characteristics of a semiconductor integrated circuit have close relation with dimensions of a pattern formed in each of processes and a layer alignment shift. Therefore, the process of manufacturing a semiconductor integrated circuit includes a inspection process of monitoring whether dimensions and a layer alignment shift are controlled or not. Since the number of patterns formed is extremely large and it is difficult to monitor all of the patterns in the inspection process, a sampling inspection, not a 100% inspection, is performed.

In a general semiconductor integrated circuit manufacturing process, a collection of a plurality of semiconductor chips formed in a plurality of silicon wafers or a single wafer is manufactured as a production lot. Therefore, in a sampling inspection, a predetermined number of wafers are selected from a production lot, and the positions and the number of chips to be inspected are selected from the selected wafers.

However, since the manufacturing process capability changes with time, in the case where a sampling inspection is conducted by using a predetermined sampling plan, there is a possibility that a risk of regarding a non-defective lot as a defective lot (hereinbelow, called "producer's risk") and a risk of overlooking a defective lot (hereinbelow, called "consumer's risk") varies.

To address the problem, a method of changing the sampling plan (for example, the sample size or sampling position) may be employed.

As general sampling inspections, an attribute sampling inspection of theoretically generating an operating characteristic curve (hereinbelow, called "OC curve") based on a hypergeometric distribution and calculating an α risk and a β risk (see H. F. Dodge and H. G. Roming: "Single Sampling and Double Sampling Inspection Tables", The Bell System Technical Journal, pp. 1-61 (1941), hereinbelow, called "non-patent document 1") and a sampling inspection by variables for theoretically generating an OC curve based on a noncentral t distribution in which normal population is assumed and calculating an α risk and a β risk (see Military Standard: "Sampling Procedures and Tables for Inspection by Variables for Percent Defective: MIL-STD-414" (1957), hereinbelow, called "non-patent document 2") are known. In a general inspection process, the sampling inspection disclosed in the non-patent document 1 or 2 is performed on a plurality of sampling plans.

However, since the precondition of the sampling inspections of the non-patent documents 1 and 2 is random sampling, an OC curve for a general semiconductor integrated circuit sampling inspection cannot be generated.

Since the precondition of the sampling inspection by variables of the non-patent document 2 is that the population follows a normal distribution, the OC curve of a nonnormal distribution of the population cannot be generated.

On the other hand, a method of generating an OC curve empirically by 100% inspection data in actual products in place of theoretically generating an OC curve is considered.

It is however difficult to empirically generate the OC curve for the following two reasons. A first reason is that, since the horizontal axis for the OC curve indicates percent defective (that is, the fraction defectives existing in a production lot) and the vertical axis indicates the acceptance probability corresponding to the percent defective, many production lots have to be inspected to estimate the percent defective. The second reason is that although the probability of acceptance/rejection of lots at each percent defective has to be calculated by controlling the percent defective in order to empirically obtain the acceptance probability as a function of defectives, it is difficult to control the percent defective.

Specifically, in the conventional semiconductor integrated circuit manufacturing process, when the precondition of random sampling or the precondition of the normal population is not satisfied, the sampling inspection is not accurately estimated. Consequently, by performing the inspection process using the sampling inspection determined empirically by technical experts, there is a probability that an α risk and a β risk exceeding an acceptable range occur (see U.S. Pat. No. 6,868,299).

SUMMARY OF THE INVENTION

According to a first aspect of the invention, there is provided a sampling inspection estimating method comprising:

determining an acceptable range of a measured value and an acceptable range of a acceptance probability;

determining a first sampling plan to be inspected and a condition of calculating a first acceptance variables of lots;

obtaining a first measured value of a production lot based on the determined first sampling plan;

calculating first acceptance variables of lots based on the obtained first measured value and the determined condition of calculating the first acceptance variables of lots;

calculating a first acceptance probability based on the first acceptance variables of lots;

determining a second sampling plan to be inspected and a condition of calculating a second acceptance variables of lots;

obtaining a second measured value of a production lot based on the determined second sampling plan;

calculating second acceptance variables of lots based on the obtained second measured value and the determined condition of calculating the second acceptance variables of lots;

calculating a second acceptance probability based on the second acceptance variables of lots;

calculating operating characteristics of the first and second sampling plans based on the first acceptance probability and the second acceptance probability; and estimating the operating characteristics by using the determined acceptable range of the acceptance probability.

According to a second aspect of the invention, there is provided a sampling inspection estimating apparatus comprising:

an acceptable range determining unit which determines an acceptable range of a measured value and an acceptable range of a acceptance probability;

a first determining unit which determines a first sampling plan to be inspected and a condition of calculating a first acceptance variables of lots;

a first obtaining unit which obtains a first measured value of a production lot based on the first sampling plan;

a first calculating unit which calculates a first acceptance variables of lots based on the first measured value and the condition of calculating the first acceptance variables of lots, and calculates a first acceptance probability based on the first acceptance variables of lots;

a second determining unit which determines a second sampling plan to be inspected and a condition of calculating a second acceptance variables of lots;

a second obtaining unit which obtains a second measured value of a production lot based on the second sampling plan;

a second calculating unit which calculates a second acceptance variables of lots based on the second measured value and the determined condition of calculating the second acceptance variables of lots, and calculates a second acceptance probability based on the second acceptance variables of lots;

an estimating unit which calculates operating characteristics of the first and second sampling plans based on the first acceptance probability and the second acceptance probability, and estimates the operating characteristics by using the acceptable range of the acceptance probability.

According to a third aspect of the invention, there is provided a computer readable media storing sampling inspection estimating program, the program comprising:

an acceptable range determining instruction which determines an acceptable range of a measured value and an acceptable range of a acceptance probability;

a first determining instruction which determines a first sampling plan to be inspected and a condition of calculating a first acceptance variables of lots;

a first obtaining instruction which obtains a first measured value of a production lot based on the first sampling plan;

a first calculating instruction which calculates a first acceptance variables of lots based on the first measured value and the condition of calculating the first acceptance variables of lots, and calculates a first acceptance probability based on the first acceptance variables of lots;

a second determining instruction which determines a second sampling plan to be inspected and a condition of calculating a second acceptance variables of lots;

a second obtaining instruction which obtains a second measured value of a production lot based on the second sampling plan;

a second calculating instruction which calculates a second acceptance variables of lots based on the second measured value and the determined condition of calculating the second acceptance variables of lots, and calculates a second acceptance probability based on the second acceptance variables of lots;

an estimating instruction which calculates operating characteristics of the first and second sampling plans based on the first acceptance probability and the second acceptance probability, and estimates the operating characteristics by using the acceptable range of the acceptance probability.

BRIEF DESCRIPTION OF THE DRAWINGS

FIG. 5 is a schematic diagram showing the first calculation data in the first embodiment of the invention.

DETAILED DESCRIPTION OF THE INVENTION

Embodiments of the present invention will be described below with reference to the drawings. The following embodiments are modes for carrying out the invention and do not limit the scope of the present invention.

First Embodiment

A first embodiment of the present invention will be described.

Figure 1:
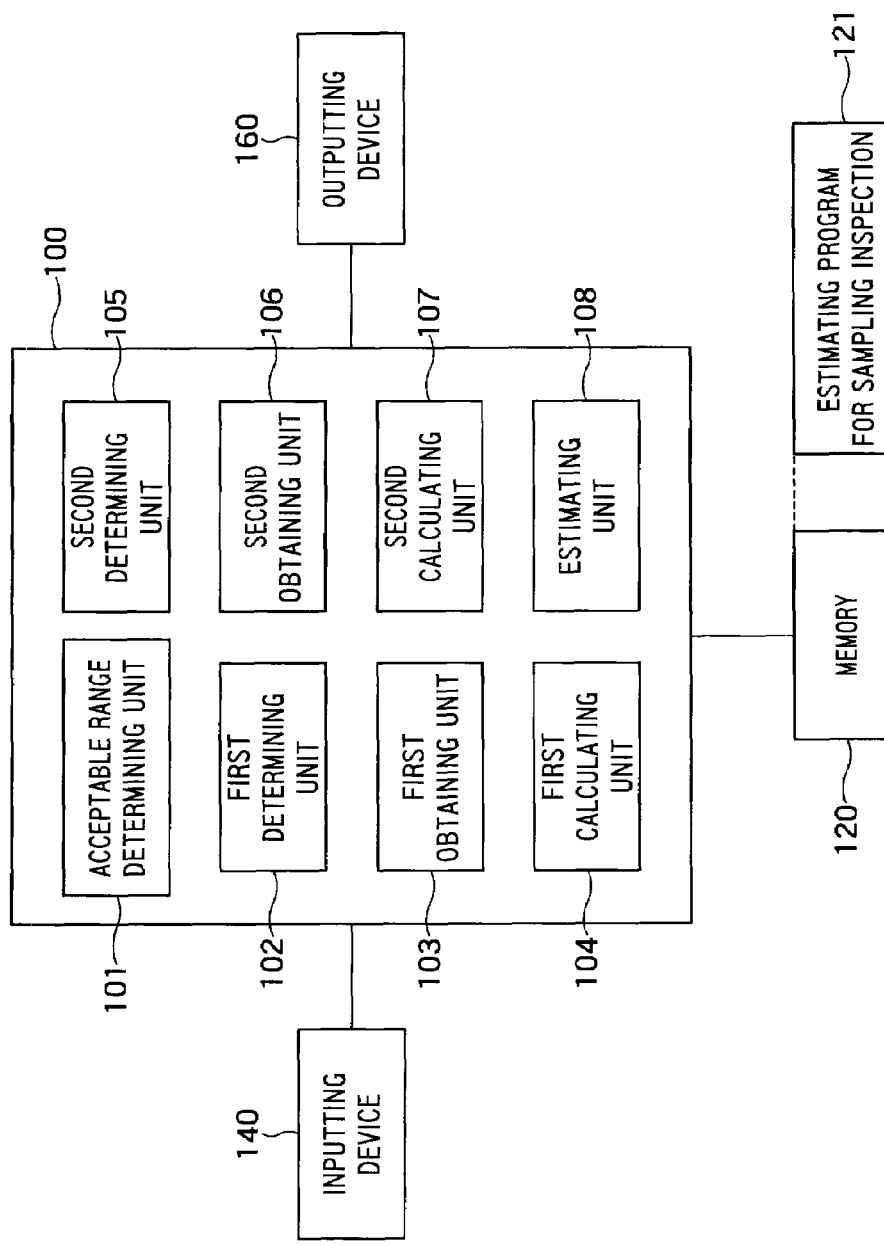
FIG. 1 is a block diagram showing the configuration of an apparatus for estimating a sampling inspection in the first embodiment of the present invention.

FIG. 1 is a block diagram showing the configuration of an apparatus for estimating a sampling inspection in the first embodiment of the present invention.

The sampling inspection estimating apparatus of the first embodiment of the invention has a processor 100, a memory 120, an inputting device 140, and an outputting device 160.

The processor 100 realizes an acceptable range determining unit 101, a first determining unit 102, a first obtaining unit 103, a first calculating unit 104, a second determining unit 105, a second obtaining unit 106, a second calculating unit 107, and an estimating unit 108 by executing an estimating program 121 for a sampling inspection stored in the memory 120.

The acceptable range determining unit 101 measures the acceptable range of a measured value based on an instruction output from the inputting device 140.

Based on the instruction output from the inputting device 140, the first determining unit 102 determines a first sampling plan for an object to be inspected and a condition of calculating acceptance variables of lots of the first sampling plan (hereinbelow, called "first acceptance variables of lots"). For example, the first sampling plan relates to the number N of wafers (called "sample wafers" below) extracted from a lot and the position in the lot of the sample wafer (called "location in the lot" below). The location in the lot is the number of the sample wafer and a position on a wafer of a chip to be inspected (called "sample chip" below) and a inspection position in the chip. For example, the condition of calculating the first acceptance variables of lots is a condition of "extracting the maximum and minimum values of measured values".

The first obtaining unit 103 obtains a measured value of a production lot (called "first measured value" below) based on the first sampling plan determined by the first determining unit 102.

The first calculating unit 104 calculates a distribution function of the first acceptance variables of lots (called "first distribution function" below) and the acceptance probability of the first sampling plan (called "first acceptance probability" below) based on the first measured value obtained by the first obtaining unit 103 and the condition of calculating the first acceptance variables of lots determined by the first determining unit 102.

The second determining unit 105 determines a second sampling plan of an object to be inspected and a condition of calculating the acceptance variables of lots of the second sampling plan (called "second acceptance variables of lots") based on the instruction output from the inputting device 140.

The second obtaining unit 106 obtains a measured value (called "second measured value" below) of a production lot based on the second sampling plan determined by the second determining unit 105.

The second calculating unit 107 calculates a distribution function (called "second distribution function" below) of the second acceptance variables of lots and the acceptance probability of the second sampling plan (called "second acceptance probability" below) based on the second measured value obtained by the second obtaining unit 106 and the condition of calculating the second acceptance variables of lots determined by the second determining unit 105.

The estimating unit 108 estimates the operating characteristics of the first and second sampling plans by comparing the first distribution function and the first acceptance probability calculated by the first calculating unit 104 to the second distribution function and the second acceptance probability calculated by the second calculating unit 107 by using the acceptable range determined by the acceptable range determining unit 101, and outputs estimation results to the outputting device 160.

The memory 120 is a computer-readable storing medium for storing the estimating program 121 for a sampling inspection for performing a sampling inspection estimating process in the first embodiment of the invention, and the like. The memory 120 also functions as a working memory of the processor 100.

The inputting device 140 accepts an instruction inputted from the user and outputs the instruction to the processor 100. For example, the inputting device 140 is a keyboard or a mouse, and the like.

The outputting device 160 prints or displays an estimation result output from the estimating unit 108. For example, the outputting device 160 is a printer or a display, and the like.

Figure 2:
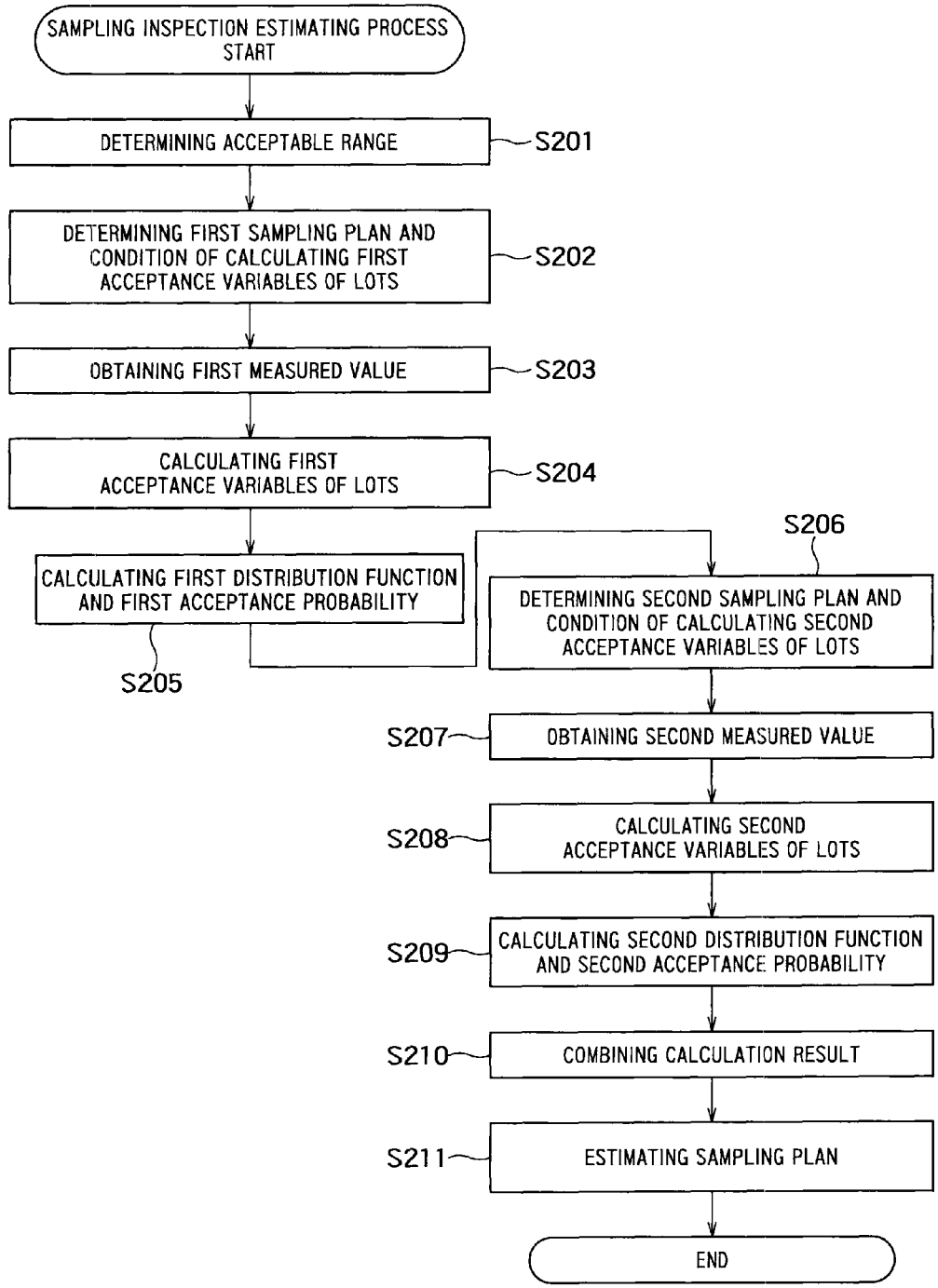
FIG. 2 is a flowchart showing the procedure of the sampling inspection estimating process in the first embodiment of the invention.

FIG. 2 is a flowchart showing the procedure of the sampling inspection estimating process in the first embodiment of the invention.

The sampling inspection estimating process in the first embodiment of the invention is performed when the estimating program 121 for a sampling inspection stored in the memory 120 is executed by the processor 100.

First, the acceptable range determining unit 101 determines the acceptable range of the acceptance probability based on an instruction output from the inputting device 140 (S201). For example, the acceptable range is determined as follows. When the first acceptance probability is 90% or higher, the second acceptance probability is 85% or higher. When the first acceptance probability is 10% or less, the second acceptance probability is 15% or less.

Figures 3, 4:
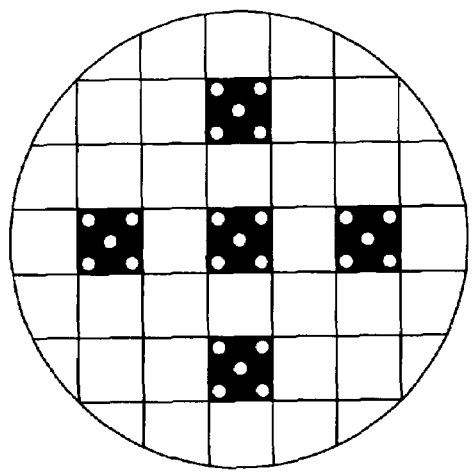
FIG. 3 is a schematic diagram showing the first sampling plan of the production lots in the first embodiment of the invention.
FIG. 4 is a schematic diagram showing the first measurement data in the first embodiment of the invention.

Then, the first determining unit 102 determines the first sampling plan of an object to be detected and a condition of calculating the first acceptance variables of lots based on the instruction output from the inputting device 140 (S202). For example, as shown in FIG. 3, in the first sampling plan of a dimension inspection, wafer number 1 is determined as a sample wafer, five chips are selected as sample chips from chips included in the sample wafer, and predetermined five locations in each of the sample chips (that is, 25 points) are selected as inspection positions. For example, the condition of calculating the first acceptance variables of lots is the maximum value compared with the upper limit of the first measured value of the sample wafer or the minimum value compared with the lower limit of the first measured value.

Then, the first obtaining unit 103 obtains the first measured value of the production lot based on the first sampling plan determined in S202 (S203). For example, as shown in FIG. 3, a value of line width is obtained from the 25 points. At this time, as shown in FIG. 4, the first obtaining unit 103 writes data including the lot number, the wafer number, the position of the sample chip, and the kind of the pattern corresponding to the first measured value (called "first measurement data" below) into the memory 120. The larger the number of production lots determined as a sample wafer is, a first measured value which is more statistically preferable is obtained. The smaller the number of production lot determined as the sample wafer is, a first measured value whose variation is smaller is obtained.

Then, based on the condition of calculating the first acceptance variables of lots determined in S202, the first calculating unit 104 calculates the first acceptance variables of lots from the first measured value of the production lot obtained in S203, and writes the data including the lot number, the sample wafer, and the first acceptance variables of lots (hereinbelow, called "first calculation data") into the memory 120 (S204). For example, as shown in FIG. 5, the first calculating unit 104 writes the first measured value and the first calculation data including the maximum and minimum values of each of the sample wafers into the memory 120 on the production lot unit basis.

Figure 6:
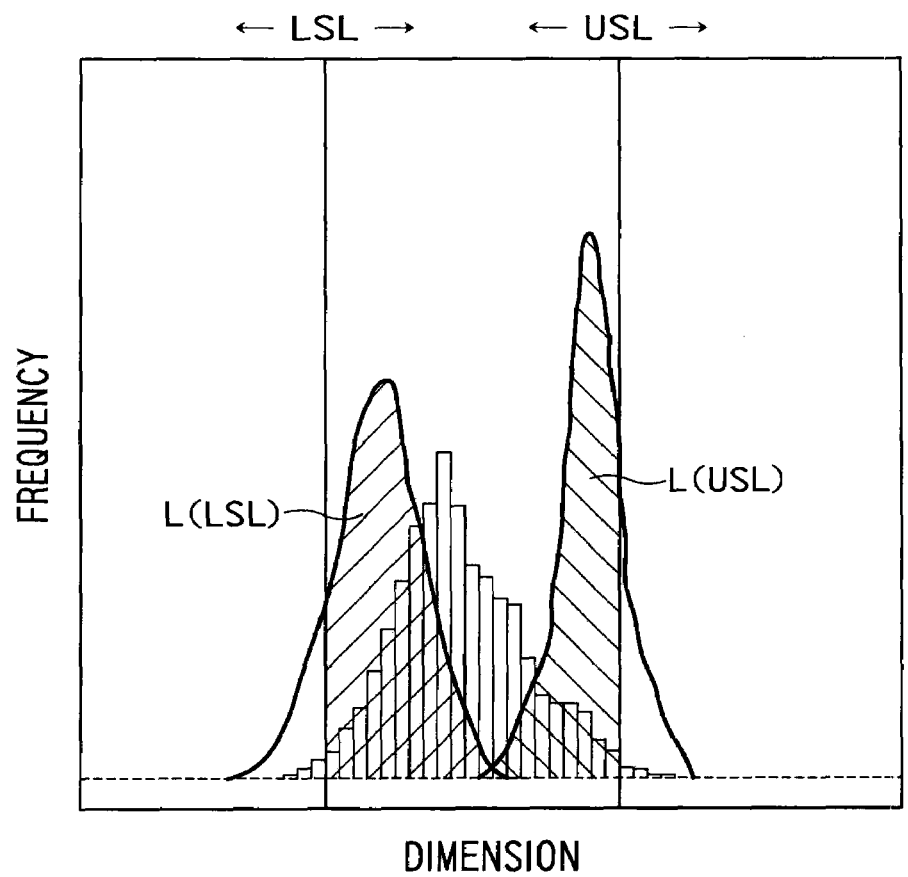
FIG. 6 is a graph showing the first distribution function in the first embodiment of the invention.

Based on the first calculation data calculated in S204, the first calculating unit 104 calculates a first distribution function and a first acceptance probability (S205). For example, as shown in FIG. 6, the first calculating unit 104 calculates a histogram of the first calculation data, smoothes the histogram by using the kernel density estimation method, and calculates, as the first distribution function, the probability density functions of the maximum and minimum values from the smoothed histogram. The first calculating unit 104 calculates a probability distribution function by performing numerical integration on the probability density function, and calculates upper and lower probabilities in an arbitrary value as first acceptance probability. Specifically, as shown in FIG. 6, while making the upper limit USL of the first measured value fluctuate, with respect to the first distribution function indicative of the probability density function of the maximum value, the first calculating unit 104 calculates the area of a portion corresponding to a dimension smaller than the upper limit USL of the first measured value as a first acceptance probability L1 (USL), which is function of the upper limit, and with respect to the first distribution function indicative of the probability density function of the minimum value, calculates the area of a portion corresponding to a dimension larger than the lower limit LSL of the first measured value as a first acceptance probability L1 (LSL) which is function of the lower limit.

Figure 7:
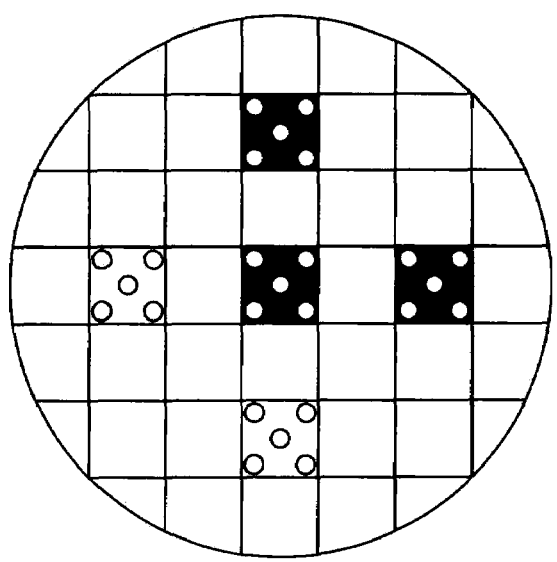
FIG. 7 is a schematic diagram showing the second sampling plan of the production lots in the first embodiment of the invention.

Then, based on an instruction output from the inputting device 140, the second determining unit 105 determines a second sampling plan of an object to be inspected and a condition of calculating a second acceptance variables of lots (S206). For example, as shown in FIG. 7, in the second sampling plan of a dimension inspection, 15 points obtained by excluding predetermined five locations in each of two chips (that is, 10 points) out of the 25 points in the first sampling plan determined in S202 are selected as inspection positions. For example, the condition of calculating the second acceptance variables of lots is expressed as Equation (1). In Equation (1), $\bar{x}$ denotes an average value of samples, "s" denotes standard deviation of the samples, and the acceptance coefficient "k" denotes an acceptance variable (for example, k=2.0). Sings are "+" for the upper limit and "−" for the lower limit. In place of the average value of the samples, a median of the samples may be used.

$$q=\bar{x}\pm ks, k=2.0 \qquad \text{Equation (1)}$$

Then, the second obtaining unit 106 obtains a second measured value of the production lot based on the second sampling plan determined in S206 (S207). For example, as shown in FIG. 7, a value of line width is obtained from the 15 points. At this time, the second obtaining unit 106 writes data including the lot number, the wafer number, the position of the sample chip, and the kind of the pattern corresponding to the second measured value (called "second measurement data" below) into the memory 120. The larger the number of production lots determined as a sample wafer is, a second measured value which is more statistically preferable is obtained. The smaller the number of production lots determined as the sample wafer is, a second measured value whose variation is smaller is obtained.

Then, based on the condition of calculating the second acceptance variables of lots determined in S206, the second calculating unit 107 calculates the second acceptance variables of lots from the second measured value of the production lot obtained in S207, and writes the data including the lot number, the sample wafer, and the second acceptance variables of lots (hereinbelow, called "second calculation data") into the memory 120 (S208). For example, the second calculating unit 107 writes the second measured value and the second calculation data including the maximum and minimum values of each of the sample wafers into the memory 120 on the production lot unit basis.

Then, based on the second calculation data calculated in S208, the second calculating unit 107 calculates a second distribution function and a second acceptance probability (S209). For example, the second calculating unit 107 calculates a histogram of the second calculation data, smoothes the histogram by using the kernel density estimation method, and calculates, as second distribution functions, the probability density functions of the maximum and minimum values from the smoothed histogram. The second calculating unit 107 calculates a probability distribution function by performing numerical integration on the probability density function, and calculates upper and lower probabilities in an arbitrary value as second acceptance probability. Specifically, as shown in FIG. 6, while making the upper limit USL of the second measured value fluctuate, with respect to the second distribution function indicative of the probability density function of the maximum value, the second calculating unit 107 calculates the area of a portion corresponding to a dimension smaller than the upper limit USL of the second measured value as a second acceptance probability L2 (USL), which is function of the upper limit, and with respect to the second distribution function indicative of the probability density function of the minimum value, calculates the area of a portion corresponding to a dimension larger than the lower limit LSL of the second measured value as a second acceptance probability L2 (LSL) of acceptable lots, which is function of the lower limit.

Figure 8:
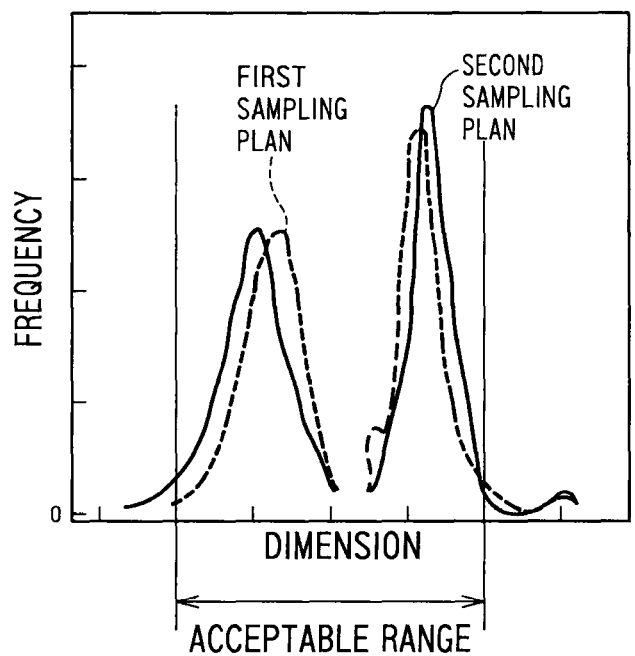
FIG. 8 is a graph showing the first and second distribution function combined in the first embodiment of the invention.
Figure 9:
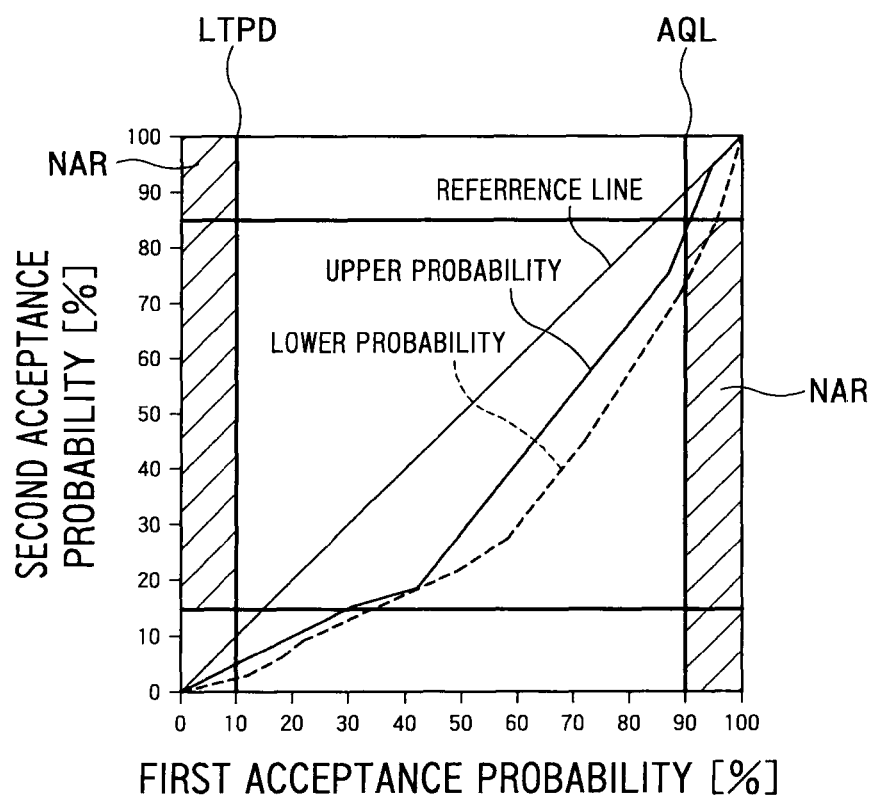
FIG. 9 is a graph showing the first and second acceptance probability combined in the first embodiment of the invention.
Figure 17:
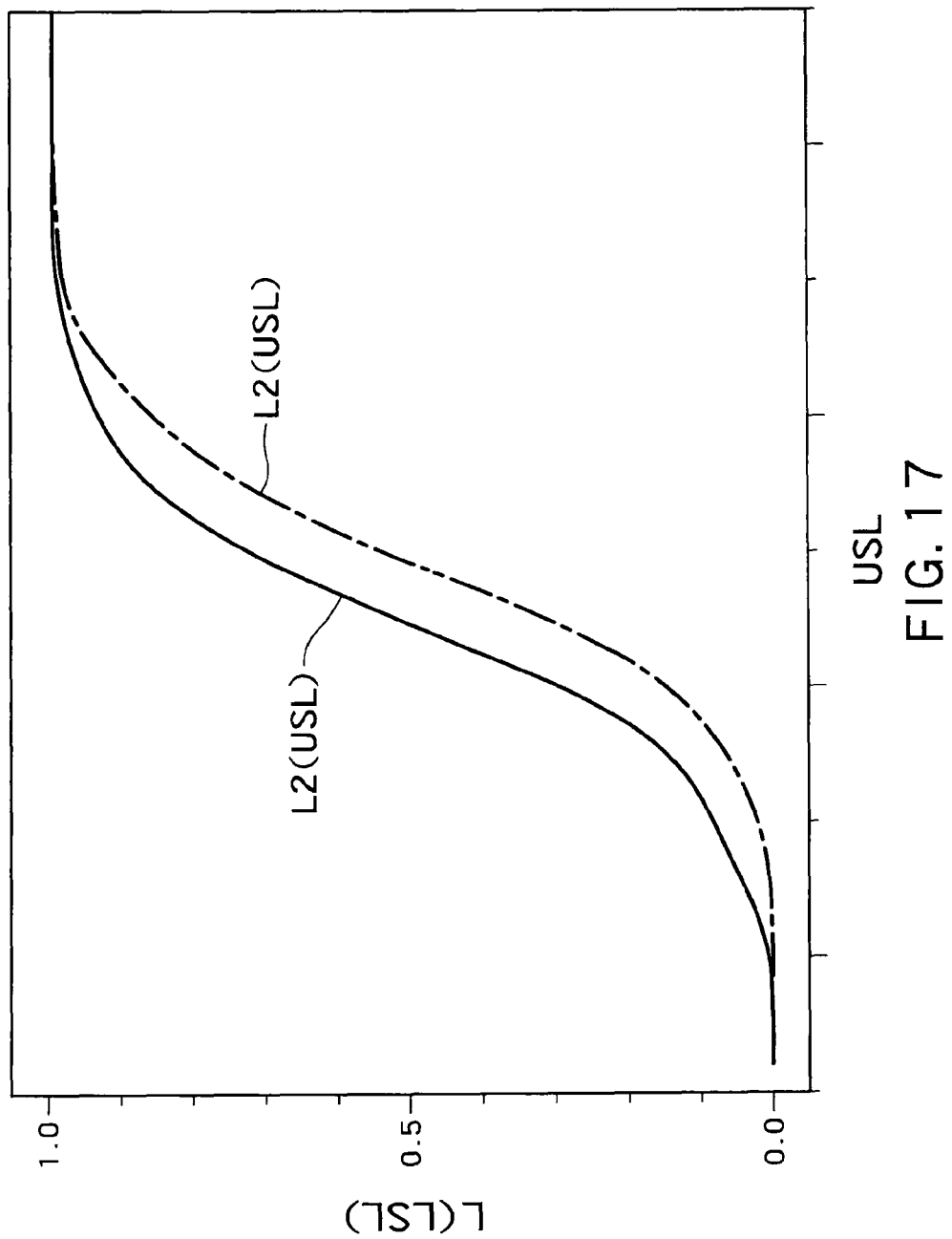
FIG. 17 is a graph showing combined result of the first acceptance probability L1 (USL) of the upper limit and the second acceptance probability L2 (USL) of the upper limit.
Figure 18:
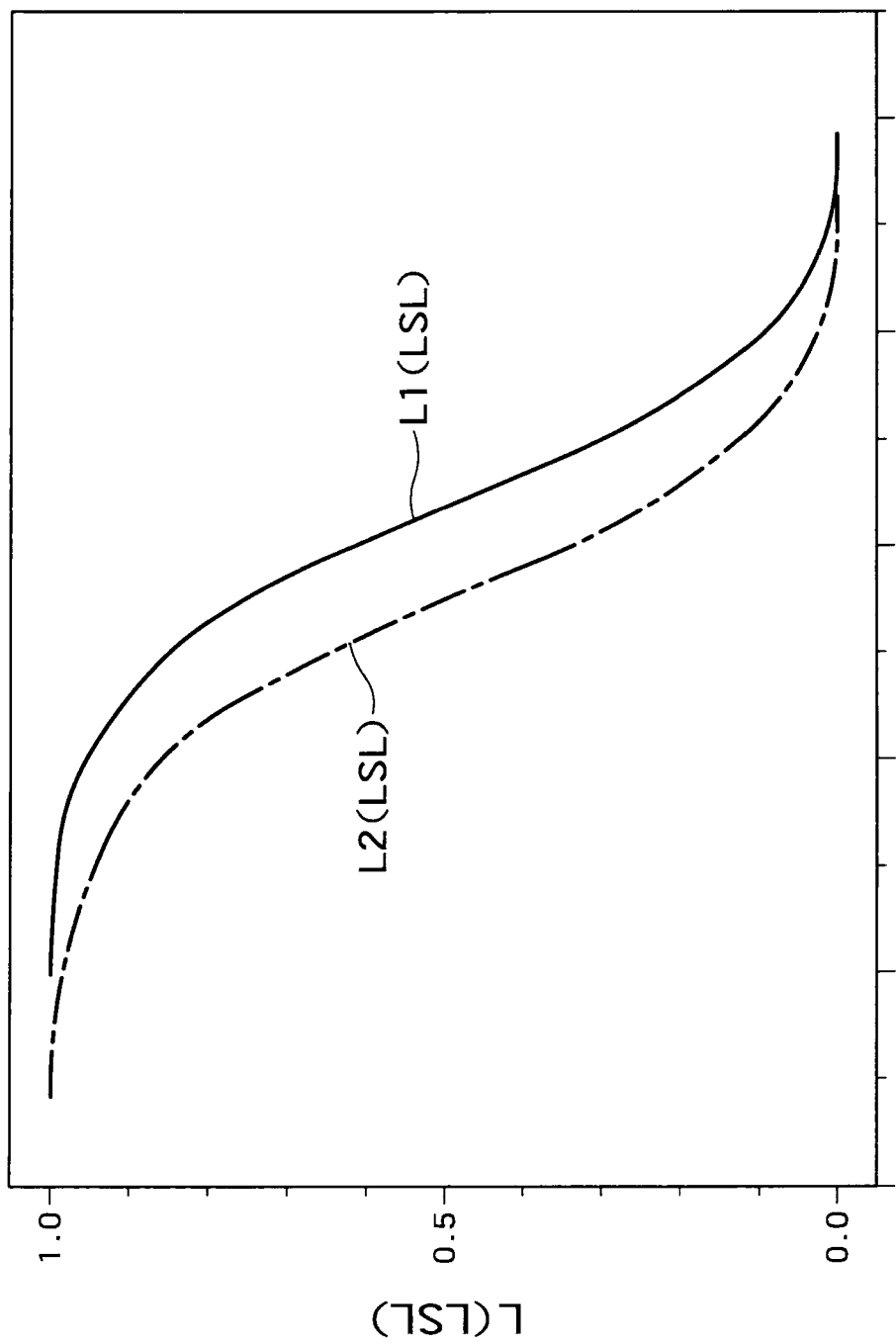
FIG. 18 is a graph showing combined result of the first acceptance probability L1 (LSL) of the lower limit and the second acceptance probability L2 (LSL) of the lower limit.

Then, the estimating unit 108 combines the calculation results of S205 and S209 (S210). For example, as shown in FIGS. 8 and 9, the estimating unit 108 combines two probability density functions and two acceptance probabilities. Specifically, the estimating unit 108 combines the first acceptance probability L1 (USL) of the upper limit and the second acceptance probability L2 (USL) of the upper limit as shown in FIG. 17, and combines the first ratio L1 (LSL) of acceptable lots of the lower limit and the second acceptance probability L2 (LSL) of the lower limit as shown in FIG. 18.

Then, the estimating unit 108 compares the calculation results combined in S210 by using the acceptable range determined in S201, estimates which sampling plan is suitable for a sampling inspection, and outputs the estimation result to the outputting device 160 (S211). For example, since the probability density function of the second sampling plan shows a wider distribution in the combination result shown in FIG. 8 and the probability of exceeding the upper and lower limits is higher than the probability density function of the first sampling plan, the estimating unit 108 estimates that the acceptance probability is lower when the first sampling plan is changed to the second sampling plan. In the acceptable range determined in S201, the second acceptance probability is 85% or higher when the first acceptance probability is 90% or higher, the second acceptance probability is 15% or less when the first acceptance probability is 10% or less, and at least one of the upper and lower probabilities passes through a nonacceptable range NAR (hatched portion in FIG. 9). Consequently, the estimating unit 108 outputs an estimation result that the first sampling plan should not be changed to the second sampling plan to the outputting device 160.

The sampling inspection estimating process in the first embodiment of the present invention is completed after S211.

In the first embodiment, in S203, it is also possible to determine, the number of production lots determined as a sample wafer after confirming that a lot average value, a within-lot variance, a within-wafer variance, a within-short variance, the maximum value, the minimum value, or the like is in a stable state by using the control chart method.

In the first embodiment of the invention, the case where the number of sample wafers in each production lot is one in S202 has been described. In the case where variations in wafers are large, the number of sample wafers per production lot is preferably two or more.

In the first embodiment of the invention, the case where the number of sample chips on each sample wafer is five in S202 has been described. In the case where variations among chips are small, the number of sample chips on each sample wafer is preferably four or less.

Although the example of calculating the distribution function by using the histogram and the kernel density estimation method in S205 and S209 has been described, the distribution function calculating method is not limited to the example. For example, it is also possible to calculate the maximum and minimum values of the determination values of acceptable lots based on measured values obtained in S203 and S207 and empirically generate a probability distribution function from the cumulative frequency. In the case where a probability distribution function of a production lot can be estimated, the distribution function may be calculated parametrically by using an equation (2). In the equation (2), $F_{MAX(N)}(x)$ denotes a probability distribution function of the maximum value of the sample size N, and $F_{MIN(N)}(X)$ denotes a probability distribution function of the minimum value of the sample size N.

$$F_{MAX(N)}(x) = \{F(x)\}^n$$

$$F_{MIN(N)}(x) = 1 - \{1 - F(x)\}^n \quad \text{Equation (2)}$$

In the first embodiment of the present invention, in the case where a common measurement point exists in the first and second sampling plans in S207, it is unnecessary to obtain a second measured value of the common measurement point. However, in the case where no common measurement point exists, second measured values of all of measurement points in the second sampling plan are obtained.

Figure 19:
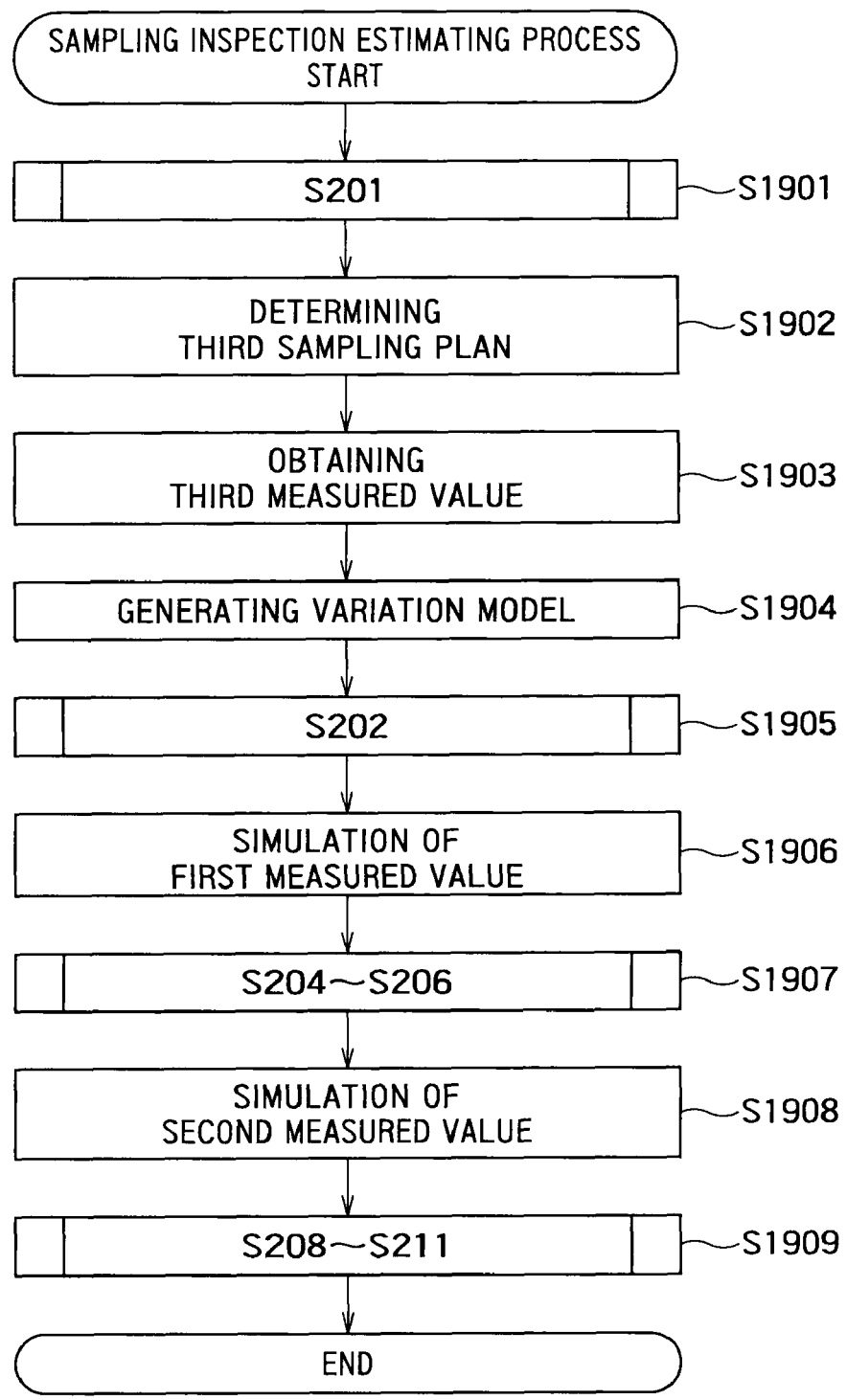
FIG. 19 is a flowchart showing the procedure of the sampling inspection estimating process in a modification of the first embodiment of the invention.

In the first embodiment of the present invention, using the first measured value or an estimation value obtained by interpolation and extrapolation based on the other pre-information in S203, a first acceptance variables of lots may be calculated in S204. The method will be described with reference to FIG. 19. FIG. 19 is a flowchart showing the procedure of processes of calculating the acceptance variables of lots as a modification of the first embodiment of the invention.

In the first embodiment of the invention, in S211, it is also possible to estimate hardness of passing a inspection by overlaying two probability density functions calculated as the first and second distribution functions on the first and second sampling plans and detecting the distribution function having a longer bottom.

In the first embodiment of the invention, S211, it is also possible to calculate the upper and lower probabilities in a predetermined value from the two probability distribution functions calculated as the first and second distribution functions and compare the calculated values.

In the first embodiment of the invention, in S211, a statistical test such as the Kolmogorov and Smirnov test for estimating the difference between the first and second distribution functions may be used.

In the first embodiment of the invention, the example in which the first and second distribution functions are given as equations, functions on a program, or a graph has been described. The first and second distribution functions may be given as a mathematical table. For example, the first and second distribution functions may be given as a mathematical table including first and second determination values of acceptable lots to be compared with the maximum and minimum values of a predetermined number corresponding to each of the rows in FIG. 4.

According to the first embodiment of the invention, even in the case where the precondition of random sampling and the precondition of normal population are not satisfied, the sampling inspection can be estimated accurately and, moreover, a inspection process can be performed by using the optimum sampling inspection method.

A modification of the first embodiment of the present invention will now be described referring to FIG. 19. The modification of the first embodiment of the invention relates to an example of calculating the measured value of each lot or each wafer, using variation model which is indicative of variation of the measured value. FIG. 19 is a flowchart showing the procedure of the sampling inspection estimating process in a modification of the first embodiment of the invention.

First, as shown in FIG. 19, a step which is similar to the step of S201 in FIG. 2 is conducted (S1901). Then, the first determining unit 102 determines a third sampling plan for determining the variation model (S1902).

Then, the first obtaining unit 103, for a predetermined number (for example, 20) of successive production lots, selects one among the production lots, measures a dimension of the selected production lot, and obtains a third measured value (dimension data $\{CD_i\}$) which is a function of wafer coordinates $(x_i, y_i)$, whose zero point is a center of the wafer (S1903).

Then, the first calculating unit 104 generates the variation model based on the third measured value (S1904). For example, as shown in Equation 6, the first calculating unit 104 fits a distribution of the measured value in wafer to a model expressing a concentric special distribution. Then, the first calculating unit 104 calculates a fitting residual error $\epsilon_i$. Then, the first calculating unit 104 calculates a standard deviation $\sigma_f$. Then, the first calculating unit 104 solves the Equation 6 to calculate coefficients A and B, and generates the variation model. In Equation 6, "i" is a suffix of the third measured value, "CD" is a dimension data, E is a fitting residual error, A and B are coefficients determined using a method of least-squares, coordinates (x, y) is a wafer coordinates whose zero point is a center of the wafer. A right side of Equation 6 is the variation model having a space distribution of quadric surface shape. The space distribution shows that the dimension of the wafer is a distribution of concentric special distribution.

$$CD_i = A(x_i^2 + y_i^2) + B + \varepsilon_i \quad \text{(Equation 6)}$$

$$\sigma_f = \sqrt{\frac{\varepsilon_i^2}{48}} \quad \text{(Equation 7)}$$

Then, a step which is similar to the step of S202 in FIG. 2 is conducted (S1905). Then, the first calculating unit 104 conducts a simulation for the first measured value (S1906). For example, the first calculating unit 104 specifies all measurement points using coordinates $(x_i, y_i)$. Then, the first calculating unit 104 solves Equation 8 as a function of coordinates $(x_i, y_i)$, and store the solution into the memory 120. In the following steps, the solution is used in place of the first measured value. In Equation 8, δ is normal random number in which an average value is 0 and a standard deviation is $\sigma_f$.

$$CD = A(x^2 + y^2) + B + \delta \quad \text{(Equation 8)}$$

Then, steps which are similar to the steps of S204 to S206 in FIG. 2 are conducted (S1907). Then, the second calculating unit 107 conducts a simulation for the second measured value (S1908). For example, the second calculating unit 107 solves Equation 8 similarly to the step of S1906. In the following steps, the solution is used in place of the second measured value.

Then, steps which are similar to the steps of S208 to S211 in FIG. 2 are conducted (S1909). The sampling inspection estimating process in a modification of the first embodiment of the invention is completed after that.

Alternatively, in the modification of the first embodiment of the invention, the example that the variation model is generated using quadratic surface and normal random number is described, but the invention can be modified depending on a real distribution of the dimension of the wafer. For example, in place of Equation 6, the variation model may be generated using high order surface and normal random number. Also, in place of Equation 6, the variation model may be generated using a variety of polynomials, for example, Hermite polynomial, Legendre polynomial, Zernike polynomial, and so on. Also, in place of normal random number, random number based on a variety of probability distributions may be used.

Alternatively, in the modification of the first embodiment of the invention, the example that the variation model of measurement point in the wafer is described, but the invention can be applied to the case of generating a variation model of measurement point in the chip.

Alternatively, in the modification of the first embodiment of the invention, the example that new sampling plan for generating the variation model is determined is described, but the invention can be applied to the case of generating the variation model using existing data, for example, the first sampling plan and the first measured value, or the second sampling plan and the second measured value, and so on.

According to the modification of the first embodiment of the invention, since a virtual measured value is obtained using the variation model, the same efficient as the first embodiment of the invention is accomplished even if a lot of measured values of the production lot can not be obtained.

Second Embodiment

A second embodiment of the present invention will now be described. The second embodiment of the invention relates to an example of adjusting the acceptance coefficients. Description similar to that of the first embodiment of the invention will be omitted.

Figure 10:
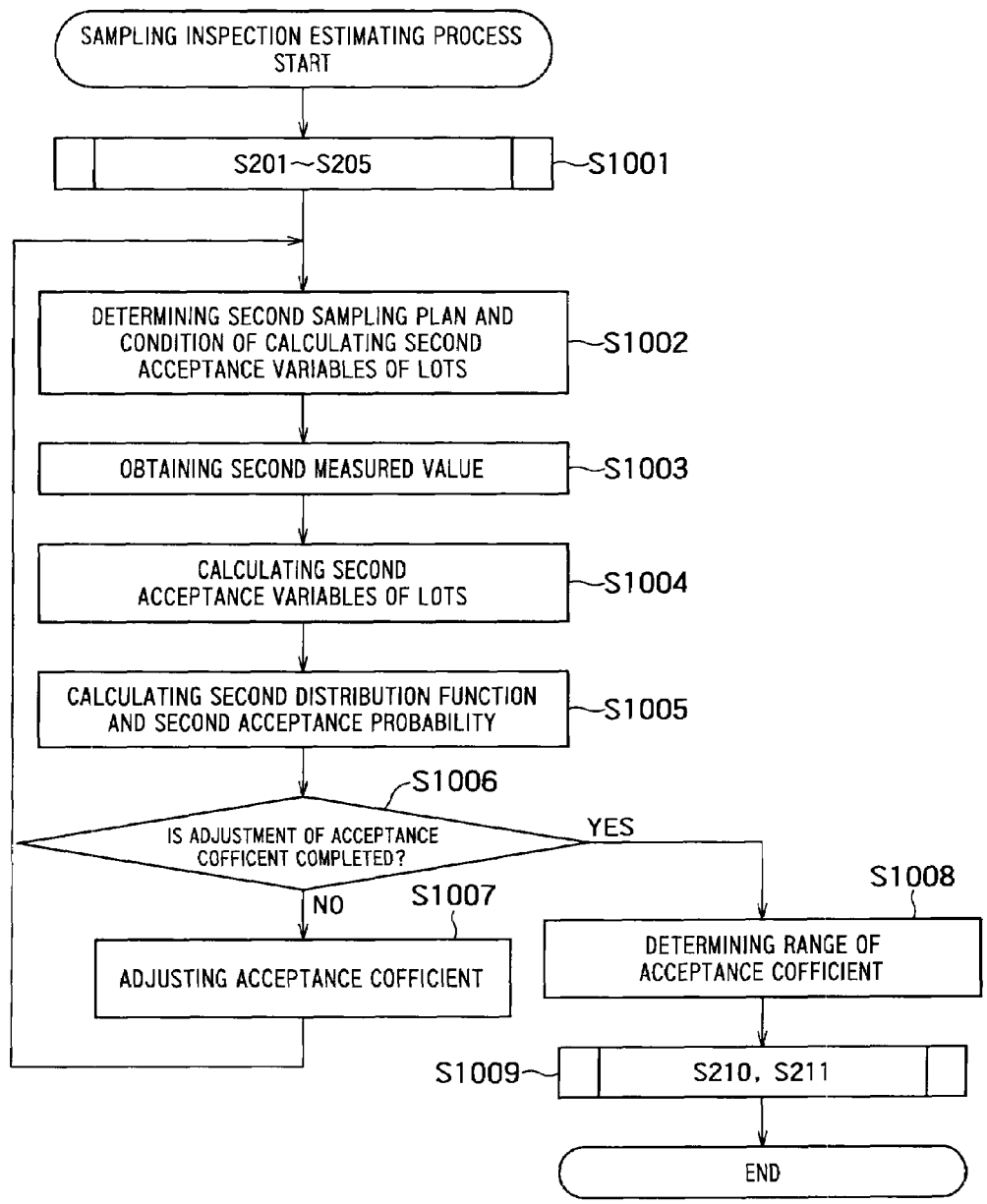
FIG. 10 is a flowchart showing the procedure of sampling inspection estimating process in the second embodiment of the invention.

FIG. 10 is a flowchart showing the procedure of process of sampling inspection estimating process in the second embodiment of the invention.

First, in a manner similar to the first embodiment of the invention, processes in S201 to S205 in FIG. 2 are performed (S1001). The acceptable range is similar to that in the first embodiment of the invention. When the first acceptance probability is 90% or higher, the second acceptance probability is 85% or higher. When the first acceptance probability is 10% or less, the second acceptance probability is 15% or less.

Then, based on an instruction output from the inputting device 140, the second determining unit 105 determines the second sampling plan to be inspected and the condition of calculating the second acceptance variables of lots (S1002).

After that, the second obtaining unit 106 obtains a second measured value of a production lot based on the second sampling plan determined in S1002 (S1003).

Then, the second calculating unit 107 calculates a second acceptance variables of lots from the second measured value of the production lot obtained in S1003 based on the condition of calculating the second acceptance variables of lots determined in S1002, and writes data including the lot number, the sample wafer, and the second acceptance variables of lots (hereinbelow, called "second calculation data") into the memory 120 (S1004).

Then, based on the second calculation data calculated in S1004, the second calculating unit 107 calculates a second distribution function and a second acceptance probability (S1005).

In the case where adjustment of acceptance coefficient is not completed (NO in S1006), the acceptance coefficient "k" is adjusted, and the program returns to S1002 (S1007).

Figure 11:
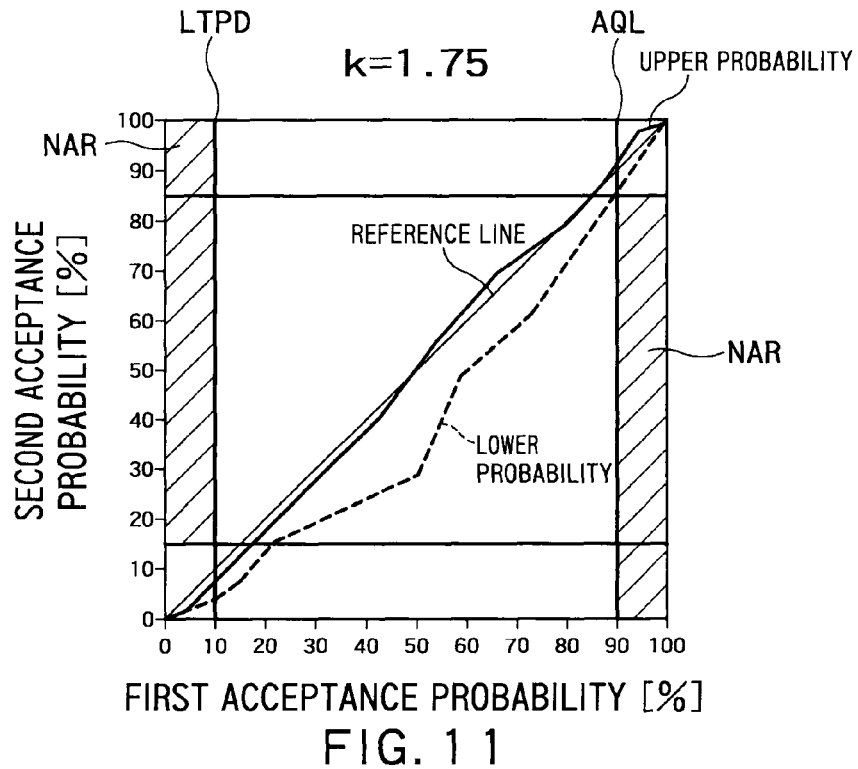
FIGS. 11 and 12 are graphs showing the first and second acceptance probability combined in the second embodiment of the invention.
Figure 12:
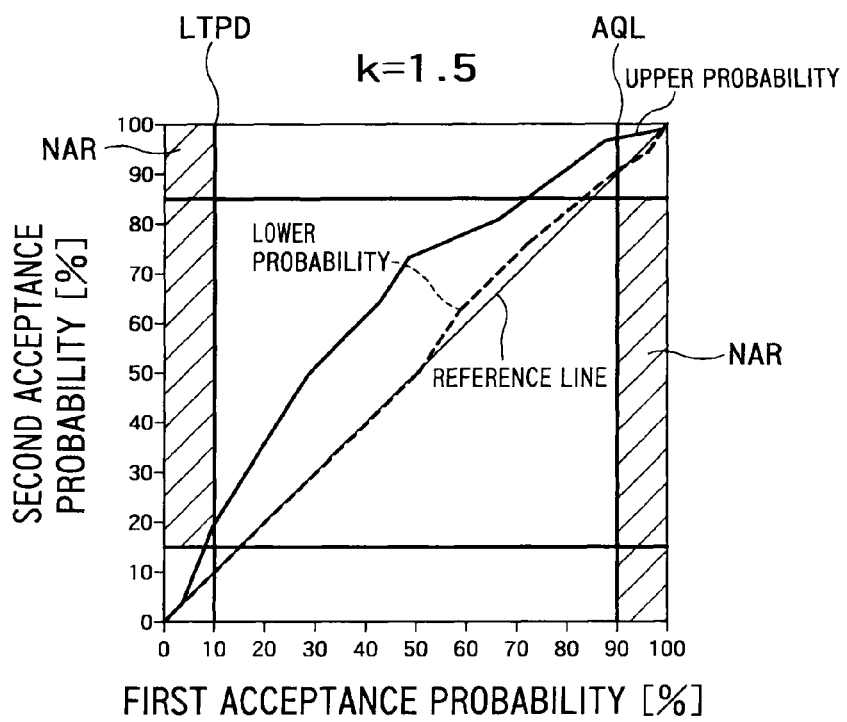

In the case where adjustment of the acceptance coefficient is completed (YES in S1006), the range of the acceptance coefficient "k" satisfying the acceptable range is determined (S1008). For example, in the case where the acceptance coefficient k=1.75 as shown in FIG. 11, when the first acceptance probability is 90% or higher, the second acceptance probability does not become below 850%. In the case where the acceptance coefficient k=1.5 as shown in FIG. 12, when the first acceptance probability is 10% or less, the second acceptance probability does not become higher than 20%. Consequently, the range of the acceptance coefficient "k" is determined as 1.5 to 1.75. Considering that the consumer's risk is reduced as much as possible, in the case where the acceptance coefficient k=1.5 shown in FIG. 12, as compared with the case where the acceptance coefficient k=1.75 shown in FIG. 11, since the upper probability passes nearer the non-acceptable range NAR, it is preferable to determine that the acceptance coefficient k=1.75.

Then, in a manner similar to the first embodiment of the invention, the processes in S210 and S211 in FIG. 2 are performed (S1009).

The process of estimating the sampling inspection in the second embodiment of the invention is completed after S1009.

According to the second embodiment of the invention, the acceptance coefficient "k" is adjusted and determined so as to satisfy the acceptable range. Consequently, the sampling inspection method can be estimated by using the optimum acceptance coefficient from a plurality of acceptance coefficient.

Third Embodiment

A third embodiment of the present invention will now be described. The third embodiment of the invention relates to an example of calculating the second acceptable lots determination value by using an n-th moment. Description similar to that of the first and second embodiments of the invention will be omitted.

Figure 13:
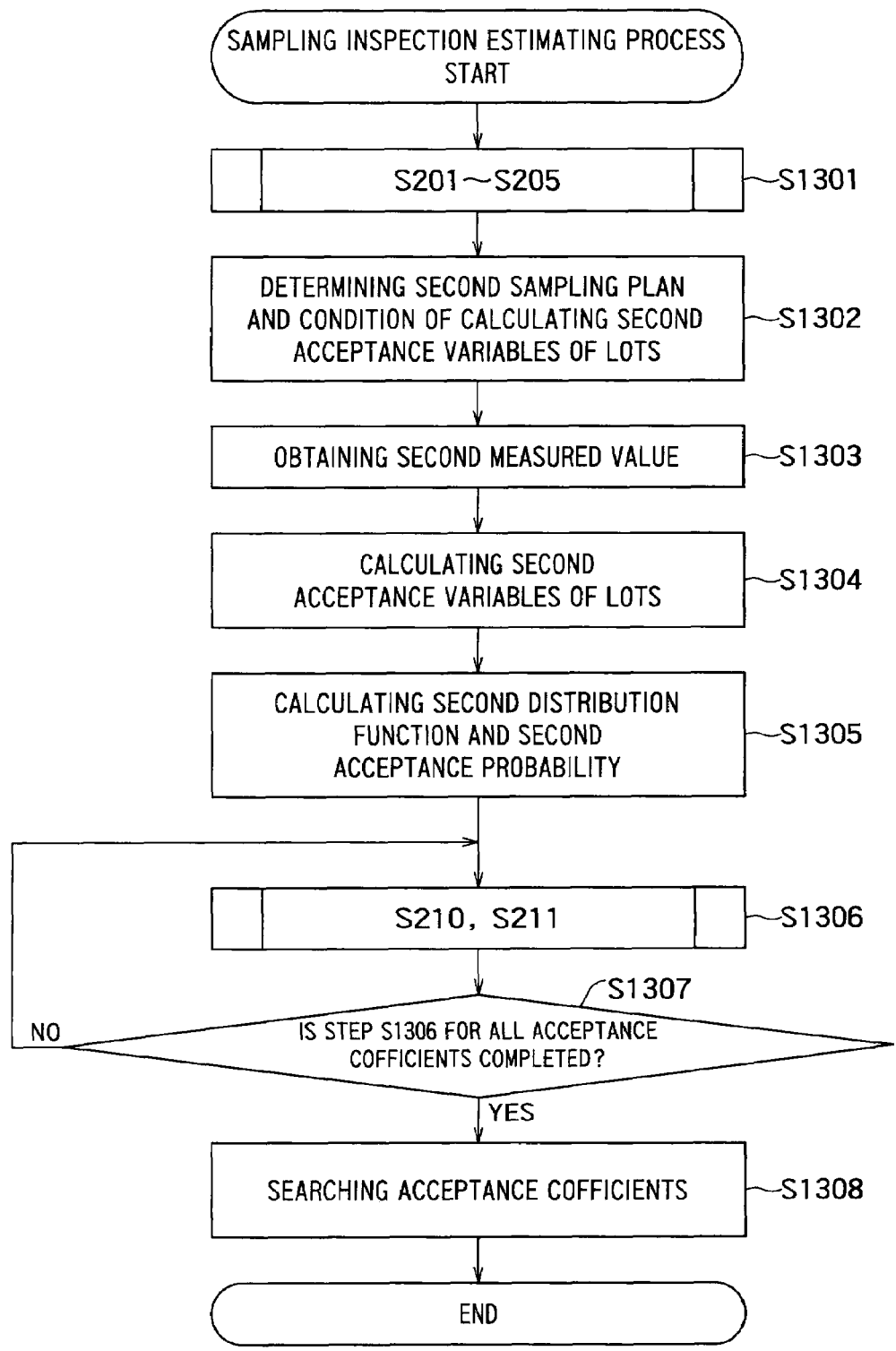
FIG. 13 is a flowchart showing the procedure of the sampling inspection estimating process in the third embodiment of the invention.

FIG. 13 is a flowchart showing the procedure of sampling inspection estimating process in the third embodiment of the invention.

First, in a manner similar to the first embodiment of the invention, the processes in S201 to S205 in FIG. 2 are performed (S1301). The acceptable range is similar to that in the first embodiment of the invention. When the first acceptance probability is 90% or higher, the second acceptance probability is 85% or higher. When the first acceptance probability is 10% or less, the second acceptance probability is 15% or less.

Then, based on an instruction output from the inputting device 140, the second determining unit 105 determines the second sampling plan to be inspected and the condition of calculating the second acceptance variables of lots (S1302). For example, the condition of calculating the second acceptable lots determination value is expressed by equation (3). In the equation (3), x̄ denotes an average value of samples, "s" denotes standard deviation of the samples, $x_j$ denotes the j-th sample, and k, k', and k" denote acceptance coefficients. Sings are "+" for the upper limit and "−" for the lower limit. ζ indicates skewness of a sample which is defined by equation (4). κ denotes kurtosis of the sample which is defined by the equation (5). In the condition of calculating the second acceptance variables of the third embodiment of the invention, computation including the n-th (n denotes natural number) moment of the sample in the second sampling plan is performed as shown by equations (3) to (5).

$$q = \bar{x} \pm ks(1 + k'\varsigma + k''\kappa), k = 2.0 \qquad \text{Equation (3)}$$

$$\varsigma = \frac{n}{(n-1)(n-2)} \sum_{j=0}^{n} \left[\frac{x_j - \bar{x}}{s}\right]^3 \qquad \text{Equation (4)}$$

$$\kappa = \frac{n(n+1)}{(n-1)(n-2)(n-3)} \sum_{j=0}^{n} \left[\frac{x_j - \bar{x}}{s}\right]^4 - \frac{3(n-1)^2}{(n-2)(n-3)} \qquad \text{Equation (5)}$$

Then, the second obtaining unit 106 obtains a second measured value of the production lot based on the second sampling plan determined in S1302 (S1303).

Then, the second calculating unit 107 calculates second acceptance variables of lots (S1304) from the second measured value of the production lot obtained in S1303 based on the condition of calculating the second acceptance variables in S1302, and writes data including the lot number, the sample wafer, and the second acceptance variables of lots (hereinbelow, called "second calculation data") into the memory 120 (S1305).

Then, in a manner similar to the first embodiment of the invention, the processes in S210 and S211 in FIG. 2 are performed (S1306). The process of S1306 are repeatedly performed to all of the acceptance coefficients k, k', and k" (NO in S1307).

In the case where the process of S1306 is completed on all of the acceptance coefficients k, k', and k" (YES in S1307), the values of the acceptance coefficients k, k', and k" in which the first and second acceptance probability are most approximated with each other (S1308) are searched. For example, the acceptance coefficients k=1.6, k'=0.25, and k"=0.

The process of estimating the sampling inspection in the third embodiment of the invention is completed after S1308.

Figure 14:
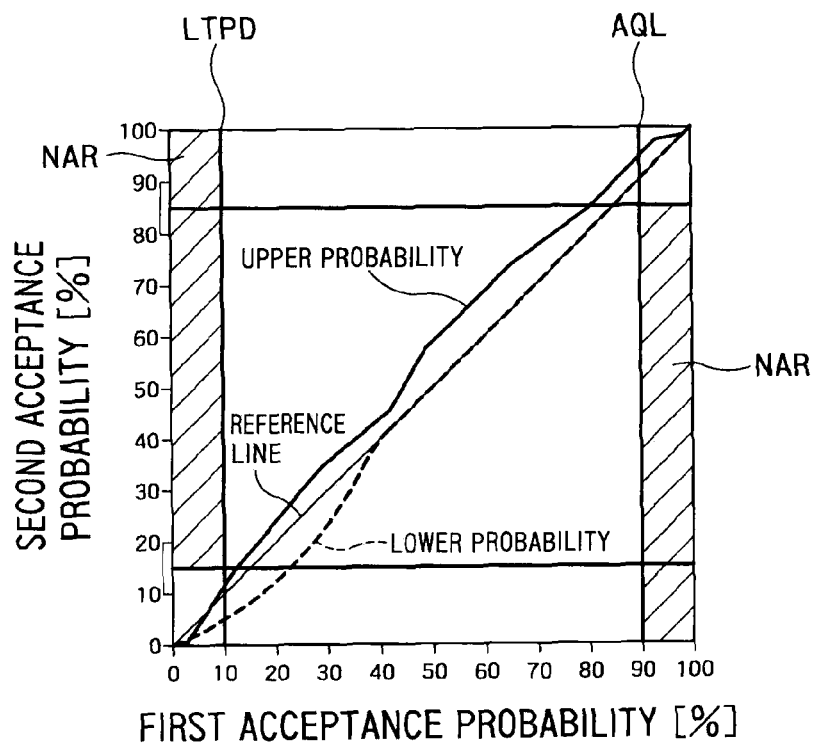
FIG. 14 is a graph showing the first and second acceptance probability combined in the third embodiment of the invention.
Figure 15:
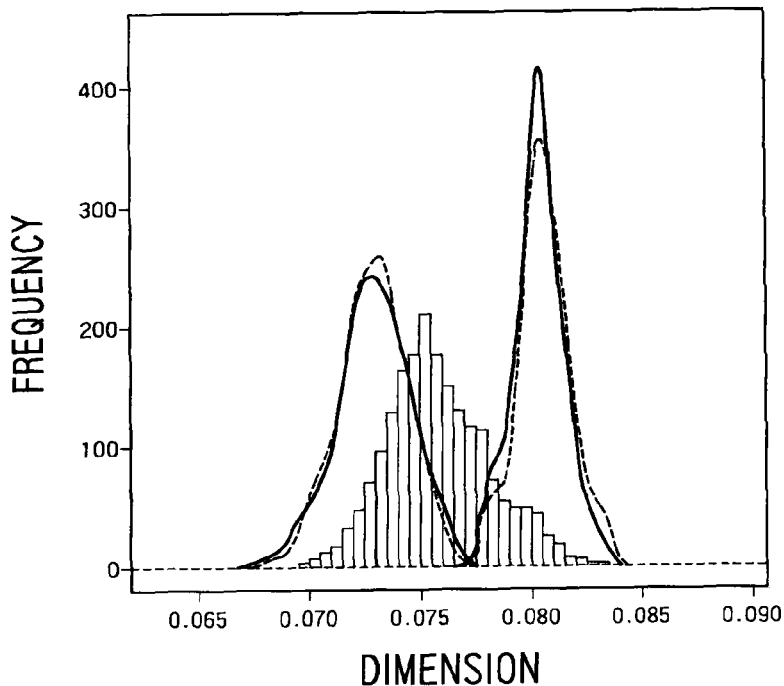
FIG. 15 is a graph showing the distribution of the acceptance variables of lots in the third embodiment of the invention.

As shown in FIGS. 14 and 15, it is difficult to make values used in a conventional sampling inspection adapted to inspections in recent years due to non-normality of the population, particularly, distortion of a population distribution. However, by calculating the second acceptance variables by using the equations (4) and (5), the calculated second acceptance variables is applied to a sampling inspection without being influenced by the non-normality of the population.

In the third embodiment of the present invention, definition of the skewness and kurtosis is not limited by the equations (4) and (5), but values of k, k', and k" which give the same operating characteristics vary.

Although the third embodiment of the invention is related to a inspection on a circuit dimension, the field of applying the present invention is not limited to the inspection but can be applied widely to general inspections using calculation values of film thickness, an alignment shift, and the like.

In the third embodiment of the invention, the number of samples taken from a production lot (that is, the number of wafers to be measured), the number of chips on a wafer, the number of measurement positions in a chip, and the like are arbitrary.

In the third embodiment of the invention, the distribution function may be estimated by using a method called re-sampling such as bootstrap method or jackknife method.

In the third embodiment of the invention, in the condition of calculating the second sampling plan and the second acceptable lots determination value, in place of the computation using the maximum value to be compared with the upper limit of the second measured value of the sample wafer or the minimum value to be compared with the lower limit of the second measured value, computation using a median or a moment function of the fifth or higher order may be employed.

In the third embodiment of the invention, the example of estimating one sampling inspection has been described. It is also possible to estimate sampling inspections of a plurality of times.

According to the third embodiment of the invention, a sampling inspection having applicability higher than that of the conventional techniques can be estimated. Particularly, how the lot acceptance probability changes due to a change in a inspecting method can be easily predicted for non-random sampling and non-normal population.

According to the third embodiment of the invention, by changing the second sampling plan and repeating the sampling inspection estimating process, whether the sampling plan fits the purpose or not can be estimated.

Fourth Embodiment

A fourth embodiment of the present invention will now be described. The fourth embodiment of the invention relates to an example of determining the second sampling plan based on fluctuations in the first measured value. Description similar to that of the first to third embodiments of the invention will be omitted.

Figure 16:
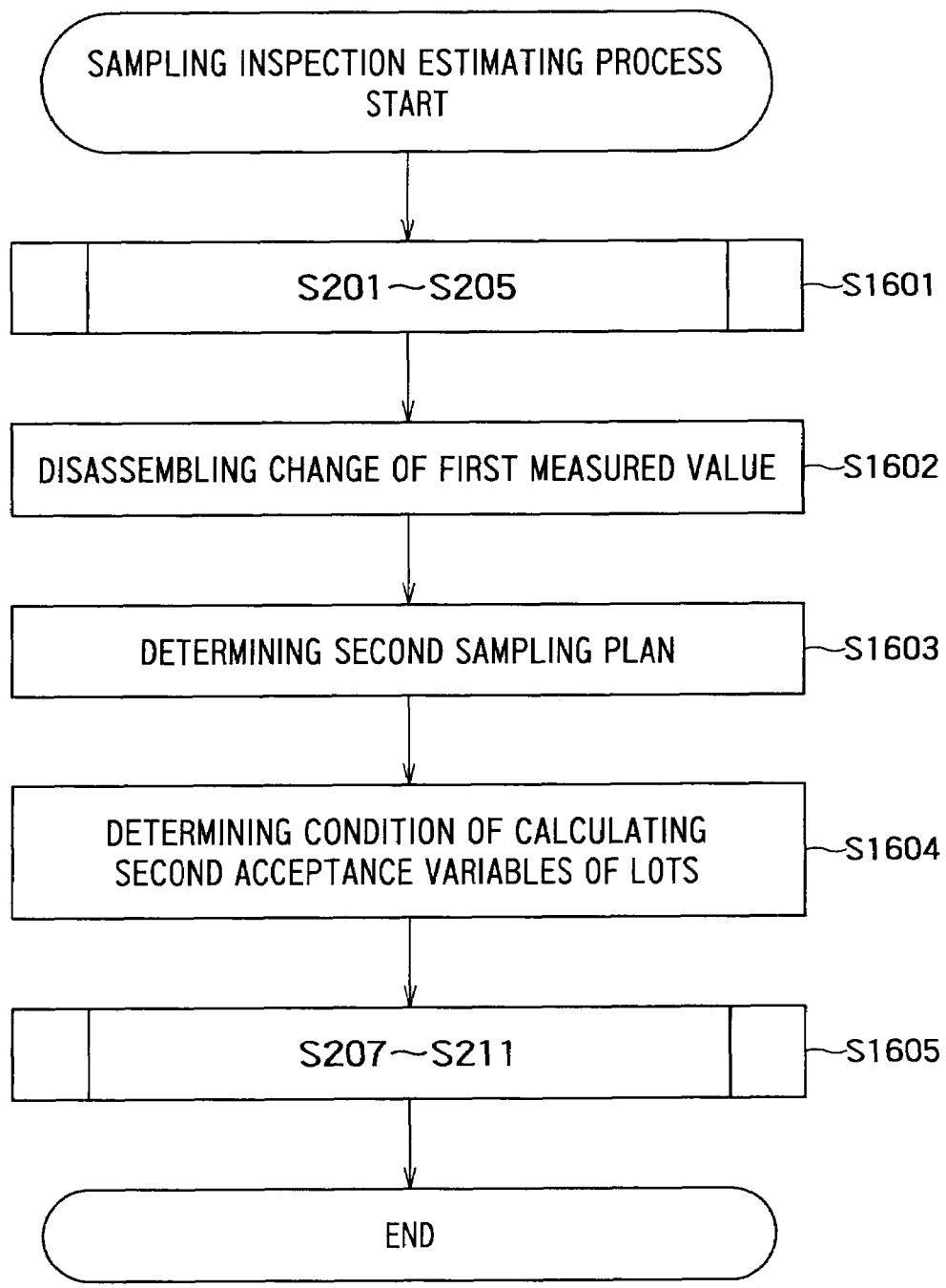
FIG. 16 is a flowchart showing the procedure of the sampling inspection estimating process in the forth embodiment of the invention.

FIG. 16 is a flowchart showing the procedure of sampling inspection estimating process in the fourth embodiment of the invention.

First, in a manner similar to the first embodiment of the invention, the processes in S201 to S205 in FIG. 2 are performed (S1601). The acceptable range is similar to that in the first embodiment of the invention. When the first acceptance probability is 90% or higher, the second acceptance probability is 85% or higher. When the first acceptance probability is 10% or less, the second acceptance probability is 15% or less.

Then, the second determining unit 105 disassembles a change in the first measured value obtained in S1601 into error factors by the analysis of variance (S1602). For example, the error factors are a factor of an error between wafers, a factor of an error between chips, a factor of an error between patterns, and other error factors.

Then, the second determining unit 105 finds out a factor which is not significant as compared with the analysis result of S1602 and deletes a measurement point corresponding to the factor, thereby determining a second sampling plan to be inspected (S1603). For example, when an analysis result that the factor of an error among chips is not significant is shown in S1602, as shown in FIG. 7, even when measurement points are partially deleted from the measurement points of the sample chip of FIG. 3, the operating characteristics are unchanged. For example, when an analysis result that the factor of an error among patterns is not significant is shown in S1602, even if a specific measurement pattern is deleted from all of sample chips, the operating characteristics are unchanged.

Then, the second determining unit 105 determines the condition of calculating the second acceptance variables of lots based on an instruction output from the inputting device 140 (S1604).

Then, in a manner similar to the first embodiment of the invention, the processes in S207 to S211 are performed (S1605).

The sampling inspection estimating process in the fourth embodiment of the invention is completed after S1605.

In the fourth embodiment of the invention, it is also possible to repeat the processes in S1603 to S1605 a plurality of times while changing points to be deleted in S1603 and compare the first acceptance probability with a plurality of second ratios of acceptable lots. In this case, the second sampling plan in which time required for measurement is the shortest (that is, the number of samples is the smallest) is preferable. In the case where a plurality of second sampling plans in which the numbers of samples are the same but layouts are different from each other exist, it is preferable to simulate the measuring procedure of a measuring device and determine a second sampling plan in which time required for measurement is the shortest, or a second sampling plan in which a path for circulating the measurement points is the shortest.

According to the fourth embodiment of the invention, by deleting measurement points based on a change in a first measured value, the second sampling plan is determined. Thus, a sampling inspection can be estimated using a properer second sampling plan.

The apparatus for estimating a sampling inspection described above may be at least partially configured by hardware or software. If configured by software, a program which realizes at least some of functions of the apparatus for estimating a sampling inspection may be recorded on a recording medium such as a flexible disc or a CD-ROM and may be executed by a computer. The recording medium is not limited to a removable one such as a magnetic disc or an optical disc, but can be applied to a fixed recording medium such as a hard disc device or a memory.

A program, which realizes at least some of functions of the apparatus for estimating a sampling inspection, may be distributed through a communication circuit (including a wireless communication) such as the Internet. Also, the program may distribute by means of a fixed and wireless circuit such as the Internet or a recording medium in an encrypted state or a modulated or compressed state.

What is claimed is:

1. A computer-implemented method for evaluating a sampling inspection, the method comprising:
    determining, by a processor, a first sampling plan to be inspected and a first condition for calculating a first acceptance variables variable of a lot;
    obtaining a first measured value of a production lot based on the first sampling plan;
    calculating the first acceptance variable based on the first measured value and the first condition;
    calculating a first acceptance probability based on the first acceptance variable;
    determining a second sampling plan to be inspected;
    determining a second condition for calculating a second acceptance variable of the lot by computing a linear combining function comprising
        a median value of samples in the second sampling plan, and
        a product of a standard deviation of the sample in the second sampling plan and an acceptance coefficient;
    obtaining a second measured value of the production lot based on the second sampling plan;
    calculating the second acceptance variable based on the second measured value and the second condition;
    calculating a second acceptance probability based on the second acceptance variable;
    calculating a first operating characteristic of the first sampling plan based on the first acceptance probability;
    calculating a second operating characteristic of the second sampling plan based on the second acceptance probability;
    determining an acceptable range of the first acceptance probability and an acceptable range of the second acceptance probability; and
    evaluating the first operating characteristic and the second operating characteristic by using the acceptable range of the first acceptance probability and the acceptable range of the second acceptance probability.

2. The method according to claim 1, wherein determining the second sampling plan comprises:
    calculating a plurality of candidates of the second sampling plan while deleting a part of points where the first measured value is measured in the first sampling plan; and
    selecting a candidate whose inspection time is the shortest among the plurality of candidates as the second sampling plan.

3. The method according to claim 1, further comprising determining an acceptable range of the first measured value and an acceptable range of the second measured value, wherein:
    in the calculation of the first acceptance probability, the acceptable range of the first measured value is fluctuated, and
    in the calculation of the second acceptance probability, the acceptable range of the second measured value is fluctuated.

4. The method according to claim 3, wherein in the evaluation of the first operating characteristic and the second operating characteristic, it is determined that the first sampling plan is preferable to the second sampling plan whose distribution is wider than a distribution of the first acceptable probability.

5. The method according to claim 1, wherein in the determination of the second condition, the acceptance coefficients are adjusted.

6. The method according to claim 5, wherein in the determination of the second condition, the acceptance coefficient is adjusted based on a difference between the first acceptance probability and one end of the acceptable range of the first acceptance probability, and a difference between the second acceptance probability and one end of the acceptable range of the second acceptance probability so that a consumer risk is the lowest.

7. The method according to claim 1, wherein in at least one of the obtaining of the first measured value and the obtaining of the second measured value, a virtual measured value is obtained by using a variation model which is indicative of variation of at least one of the first measured value and the second measured value.

8. An apparatus for evaluating a sampling inspection comprising:

a first determining unit configured to determine a first sampling plan to be inspected and a first condition for calculating a first acceptance variable of a lot;

a first obtaining unit configured to obtain a first measured value of a production lot based on the first sampling plan;

a first calculator configured to
calculate the first acceptance variable based on the first measured value and the first condition, and
calculate a first acceptance probability based on the first acceptance variable;

a second determining unit configured to
determine a second sampling plan to be inspected, and
determine a second condition for calculating a second acceptance variable of the lot by computing a linear combining function comprising
a median value of samples in the second sampling plan, and
a product of a standard deviation of the samples in the second sampling plan and an acceptance coefficient;

a second obtaining unit configured to obtain a second measured value of the production lot based on the second sampling plan;

a second calculator configured to
calculate the second acceptance variable based on the second measured value and the second condition, and
calculate a second acceptance probability based on the second acceptance variable;

an acceptable range determining unit configured to determine an acceptable range of the first acceptance probability and an acceptable range of the second acceptance probability; and an evaluating unit configured to
calculate a first operating characteristics of the first sampling plan based on the first acceptance probability,
a second operating characteristic of the second sampling plan based on the second acceptance probability, and
evaluate the first operating characteristic and the second operating characteristic by using the acceptable range of the first acceptance probability and the acceptable range of the second acceptance probability.

9. The apparatus according to claim 8, wherein the second determining unit is further configured to:
calculate a plurality of candidates of the second sampling plan while deleting a part of points where the first measured value is measured in the first sampling plan, and
select a candidate whose inspection time is the shortest among the plurality of candidates as the second sampling plan.

10. The apparatus according to claim 8, wherein:
the acceptable range determining unit is further configured to determine an acceptable range of the first measured value and an acceptable range of the second measured value,
the first calculator is further configured to fluctuate the acceptable range of the first measured value to calculate the first acceptance probability, and
the second calculator is further configured to fluctuate the acceptable range of the second measured value to calculate the second acceptance probability.

11. The apparatus according to claim 10, wherein the evaluating unit is further configured to determine that the first sampling plan is preferable to the second sampling plan whose distribution is wider than a distribution of the first acceptable probability.

12. The apparatus according to claim 8, wherein the second determining unit is further configured to adjust the coefficient to determine the second condition.

13. The apparatus according to claim 12, wherein the second determining unit is further configured to adjust the coefficient based on a difference between the first acceptance probability and one end of the acceptable range of the first acceptance probability, and a difference between the second acceptance probability and one end of the acceptable range of the second acceptance probability so that a consumer risk is the lowest.

14. The apparatus according to claim 8, wherein at least one of the first obtaining unit and the second obtaining unit is further configured to obtain a virtual measured value using a variation model which is indicative of variation of at least one of the first measured value and the second measured value.

15. A non-transitory computer readable medium having stored therein a computer program code for evaluating a sampling inspection, the program code comprising instructions, when executed, causing a computer to perform the following steps:
determining a first sampling plan to be inspected and a first condition for calculating a first acceptance variable of a lot;
obtaining a first measured value of a production lot based on the first sampling plan;
calculating the first acceptance variable based on the first measured value and the first condition;
calculating a first acceptance probability based on the first acceptance variable;
determining a second sampling plan to be inspected;
determining a second condition for calculating a second acceptance variable of the lot by computing a linear combining function comprising:
a median value of samples in the second sampling plan, and
a product of standard deviation of the samples in the second sampling plan and an acceptance coefficient;
obtaining a second measured value of the production lot based on the second sampling plan;
calculating the second acceptance variable based on the second measured value and the second condition;
calculating a second acceptance probability based on the second acceptance variable;
calculating a first operating characteristic of the first sampling plan based on the first acceptance probability;
calculating a second operating characteristic of the second sampling plan based on the second acceptance probability;
determining an acceptable range of the first acceptance probability and an acceptable range of the second acceptance probability; and
evaluating the first operating characteristic and the second operating characteristic by using the acceptable range of the first acceptance probability and the acceptable range of the second acceptance probability.

* * * * *